(12) United States Patent
Bu et al.

(10) Patent No.: US 7,192,894 B2
(45) Date of Patent: Mar. 20, 2007

(54) HIGH PERFORMANCE CMOS TRANSISTORS USING PMD LINER STRESS

(75) Inventors: Haowen Bu, Plano, TX (US); Rajesh Khamankar, Coppell, TX (US); Douglas T. Grider, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 10 days.

(21) Appl. No.: 10/833,419

(22) Filed: Apr. 28, 2004

(65) Prior Publication Data

US 2005/0245012 A1    Nov. 3, 2005

(51) Int. Cl.
*H01L 21/31*    (2006.01)
(52) U.S. Cl. ............... 438/791; 438/724; 438/744; 438/954; 257/E23.132
(58) Field of Classification Search ........ 438/724, 438/744, 757, 954, 791, 958; 257/E23.132
See application file for complete search history.

(56) References Cited

U.S. PATENT DOCUMENTS

| | | | | |
|---|---|---|---|---|
| 6,483,172 | B1 * | 11/2002 | Cote et al. | 257/639 |
| 6,656,853 | B2 * | 12/2003 | Ito | 438/778 |
| 2004/0253791 | A1 * | 12/2004 | Sun et al. | 438/308 |

* cited by examiner

*Primary Examiner*—Long Tran
(74) *Attorney, Agent, or Firm*—Peter K. McLarty; W. James Brady III; Frederick J. Telecky, Jr.

(57) ABSTRACT

A silicon nitride layer (110) is formed over a transistor gate (40) and source and drain regions (70). The as-formed silicon nitride layer (110) comprises a first tensile stress and a high hydrogen concentration. The as-formed silicon nitride layer (110) is thermally annealed converting the first tensile stress into a second tensile stress that is larger than the first tensile stress. Following the thermal anneal, the hydrogen concentration in the silicon nitride layer (110) is greater than 12 atomic percent.

19 Claims, 2 Drawing Sheets

US 7,192,894 B2

HIGH PERFORMANCE CMOS TRANSISTORS USING PMD LINER STRESS

FIELD OF THE INVENTION

This invention relates generally to the field of integrated circuit manufacturing and more particularly to a method for forming high performance MOS transistors.

BACKGROUND OF THE INVENTION

The performance of an integrated circuit metal oxide semiconductor (MOS) transistor depends on a number of device parameters such as gate dielectric thickness, transistor gate length, and the mobility of the electrons and/or holes in the MOS transistor channel region. The mobility of the electrons and/or holes (herein after referred to as carriers) is a measurement of how quickly the carriers traverse the transistor channel region. In general, the mobility of the carriers in the transistor channel region is related to the velocity of the carriers and the channel electric field by $\mu = V_{carriers}/E_{channel}$, where $\mu$ is the carrier mobility, $V_{carriers}$ is velocity of the carriers in the channel, and $E_{channel}$ is the electric field in the MOS transistor channel. In general, the carrier mobility is affected by a number of factors including the scattering of the carriers as they traverse the transistor channel region from the transistor source region to the transistor drain region.

An important measure of MOS transistor performance is the magnitude of the transistor drain current ($I_{DS}$) obtained for a given gate-source voltage ($V_{GS}$) and a given drain-source voltage ($V_{DS}$). In addition to being related to $V_{GS}$ and $V_{DS}$, $I_{DS}$ is also proportional to the carrier mobility $\mu$. It is therefore important that the carrier mobility $\mu$ be maximized for improving transistor performance. Recently, it has been found that the application of stress in the transistor channel region is an important factor in increasing the value of the carrier mobility $\mu$. A number of methods have been utilized to apply stress to the transistor channel region including the formation of a high stress film over the transistor structure. It has been found that the applied stress increases with film thickness. However, the high density of integrated circuits limits the thickness of the films that can be used. There is therefore a need for a method to increase the stress produced in the transistor channel by high stress films without increasing the film thickness. The instant invention addresses this need.

SUMMARY OF THE INVENTION

The instant disclosure describes a method for forming integrated circuits. In particular the method comprises forming a gate dielectric layer on the surface of a semiconductor substrate. A gate electrode is formed over the gate dielectric layer and sidewall structures are formed adjacent the gate electrode. Source and drain regions are formed in the semiconductor substrate adjacent to the sidewall structures using ion implantation.

A silicon nitride layer with a hydrogen concentration greater than 20 atomic percent and a first tensile stress is formed over the gate electrode and the source and drain regions. The silicon nitride layer is thermally annealed resulting in a second tensile stress in the silicon nitride layer where the second tensile stress is greater than the first tensile stress. In an embodiment of the instant invention the silicon nitride layer is formed at temperatures less than 350° C. Following the annealing, the hydrogen concentration in the silicon nitride layer is greater than 12 atomic percent following said thermal annealing.

BRIEF DESCRIPTION OF THE DRAWINGS

For a more complete understanding of the present invention and the advantages thereof, reference is now made to the following description taken in conjunction with the accompanying drawings, wherein like reference numerals represent like features, in which.

DETAILED DESCRIPTION OF THE INVENTION

Figure 1A:
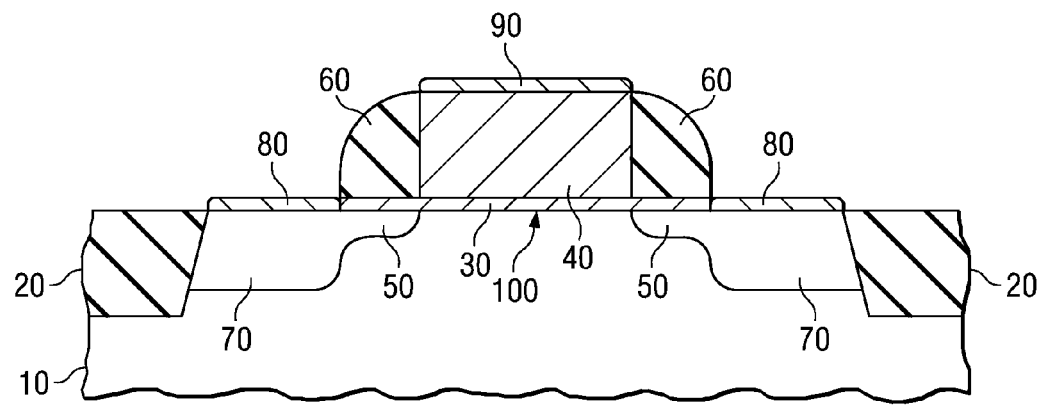
FIG. 1(a)–FIG. 1(d) are cross-sectional diagrams showing an embodiment of the instant invention.

Shown in FIG. 1(a) to FIG. 1(d) are cross-sectional diagrams of a first embodiment of the instant invention. Illustrated in FIG. 1(a) is a MOS transistor formed using integrated circuit manufacturing methods. As shown in FIG. 1(a), isolation regions 20 are formed in a semiconductor 10. The isolation regions 20 can comprise silicon oxide or any suitable dielectric material, and can be formed using shallow trench isolation (STI) or local oxidation (LOCOS) methods. A transistor gate stack comprising a gate dielectric layer 30 and a gate electrode 40 is formed on the surface of the semiconductor 10. The gate electrode 40 usually comprises a conductive material such as doped polycrystalline silicon, various metals and/or metal silicides. The gate dielectric layer 30 can comprise any suitable dielectric material such as silicon oxide, silicon nitride, silicon oxynitride, high k dielectric materials such as hafnium, and other suitable material. In this disclosure high k means dielectric material with a dielectric constant greater than 3.9. Typical thicknesses for the transistor gate stack are between 500 A and 5000 A. Following the formation of the transistor gate stack, a number of self-aligned implants are performed. These self-aligned implants include drain/source extension implants and pocket implants. The self-aligned implants that are aligned to the transistor gate stack will result in the formation of the doped drain extension regions 50 in the semiconductor 10. Sidewall structures 60 are formed adjacent to the gate electrode 40 using standard processing technology. The sidewall structures 60 typically comprise dielectric material such as silicon oxide, silicon nitride, or any other suitable dielectric material. Following the formation of the sidewall structures 60, the transistor source and drain regions 70 are formed by implanting suitable dopants into the semiconductor 10. Following the formation of the source and drain regions 70, metal silicide layers 80 and 90 are formed on the source and drain regions 70 and the gate electrode 40 respectively. In an embodiment, the metal silicide regions 80, 90 comprise nickel silicide, cobalt silicide, or any other suitable metal silicide material. In the case where the gate electrode 40 comprises a metal or a metal silicide, no silicide layer 90 will be formed on the gate electrode. As shown in FIG. 1(a), the channel region 100 of the MOS transistor structure is defined in this disclosure as that region of the substrate 10 beneath the gate electrode 40 to which the inversion layer is confined. In a MOS transistor the inversion layer is formed when a first voltage is applied to the gate electrode that exceeds a second voltage simultaneously applied to the transistor source region 70 by an amount equal or greater than the transistor threshold voltage. For a NMOS transistor the inversion layer comprises electrons. In a similar manner, the inversion layer is formed in a PMOS transistor when a first voltage is applied to the transistor source region 70 that exceeds a second voltage applied to the gate electrode 40 by an amount equal to or greater than the transistor threshold voltage. For a PMOS transistor the inversion layer comprises holes.

Figure 1B:
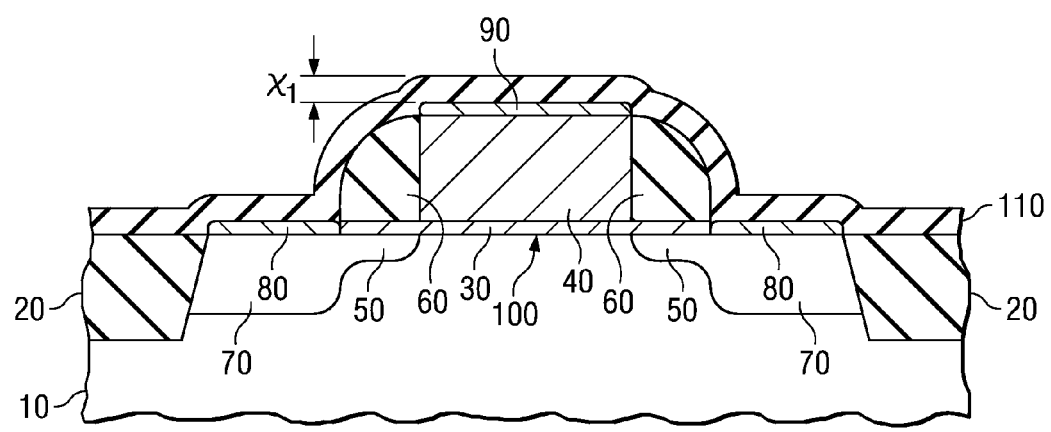

Following the formation of the MOS transistor structure shown in FIG. 1(a), a pre-metal dielectric (PMD) liner capping layer 110 is formed over the transistor structure as shown in FIG. 1(b). In an embodiment of the instant invention, the PMD liner layer 110 can comprise silicon nitride formed to a thickness $X_1$ between 50 A and 1500 A. The silicon nitride PMD liner layer 110 can be formed using a plasma enhanced chemical vapor deposition process (PECVD) at temperatures between 200° C. and 400° C., pressures between 0.5 torr and 6 torr, using a number of gases comprising $SiH_4$ at flow rates between 25 sccm and 250 sccm, and $NH_3$ at flow rates between 500 sccm and 4000 sccm. The low silicon nitride layer formation temperatures (i.e., lower than 400° C.) are required to form the meta-stable layer with a high hydrogen concentration. In an exemplary example, the process conditions are: the deposition temperature is less than about 350° C., the chamber pressure is controlled to about 3.5 torr or more, with a silane ($SiH_4$) gas flow of about 150 sccm or less, and ammonia ($NH_3$) gas flow of about 2500–3000 sccm, using high frequency RF power set at about 50 W at 13.56 MHz and low frequency power set at about 10–20 W at 350 KHz. Under the above described conditions, a silicon nitride PMD liner layer 110 is formed with a hydrogen concentration exceeding 20 atomic percent. In addition to a high hydrogen concentration, the PMD silicon nitride layer 110 is formed in a meta-stable state with a tensile stress of approximately 500 MPa.

Figure 1C:
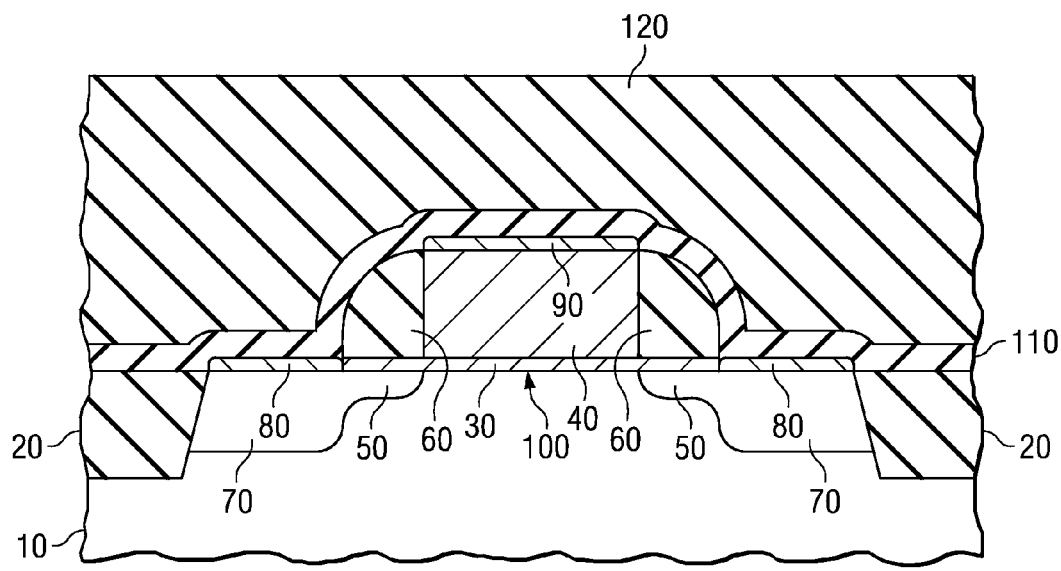

Following the formation of the PMD liner layer 110, and before the formation of the PMD layer (layer 120 in FIG. 1(c)), the PMD liner layer 110 is thermally annealed. For the embodiment described above, the PMD liner layer can be annealed at temperatures between 300° C. and 525° C. for the case where the metal silicide layers 80 comprise nickel silicide. Alternatively, if the metal silicide layers comprise cobalt silicide, the PMD liner layer can be annealed and at temperatures between 400° C. and 850° C. Following the thermal annealing process, the tensile stress in the PMD liner layer will increase to a value of approximately 1.1 GPa and the hydrogen concentration will remain at concentration levels greater than about 12 atomic percent. The simultaneous presence of a high tensile stress and high hydrogen concentration will improve the performance of the transistor by increasing the carrier mobility $\mu$ in the channel region 100. In this disclosure a high tensile stress is defined as a tensile stress in the PMD liner layer greater than 800 MPa and a high hydrogen concentration is defined as a hydrogen concentration in the PMD liner layer that exceeds 17 atomic percent.

In general, according to the instant invention, a high stress PMD liner layer is formed by first forming a meta-stable layer over a MOS transistor. The meta-stable layer comprises a hydrogen concentration greater than 20 atomic percent and a tensile stress greater than 400 MPa. Before the formation of any additional layers over meta-stable layer, the meta-stable layer is thermally annealed at temperatures between 300° C. and 900° C. in NH3 or in an inert gas such as N2, Ar, etc. to form a stable PMD liner layer with a high tensile stress (i.e. greater than 800 MPa) and a hydrogen concentration greater than about 12 atomic percent. The high stress PMD liner layer 110 comprises a stress that can exert a tensile stress in the channel region 100. As described above, a tensile stress in the channel region 100 will serve to enhance the mobility of the electrons that comprise the inversion layer in an NMOS transistor. When the nitride layer comprises both a high hydrogen content and stress, it is observed that the tensile stress in the channel region 100 will cause minimal degradation to the PMOS transistor. It is therefore not necessary to have different stress selectively applied to the NMOS and PMOS transistors. For the purpose of improving the NMOS transistors without affecting the performance of the PMOS transistors, the instant invention avoids any additional manufacturing steps that would be otherwise needed to form regions of different stress on the NMOS and PMOS transistors.

Figure 1D:
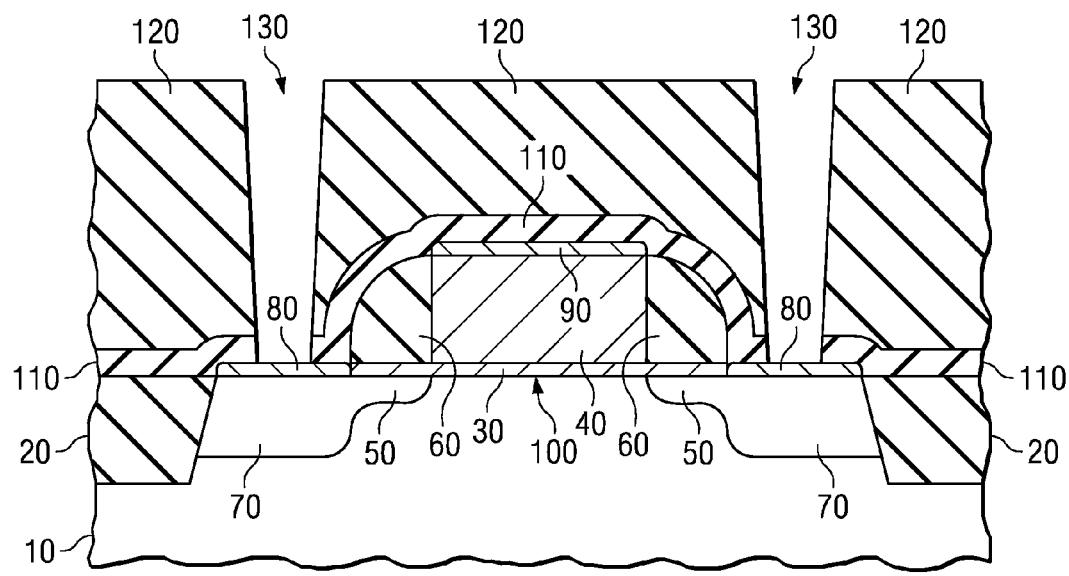

Following the formation of the high stress PMD liner layer 110, the PMD layer is formed 120. The PMD layer 120 can comprise silicon oxide, phosphorous doped silicate glass (PSG) or any other suitable dielectric material. The thickness of the PMD layer is typically 400–1000 nm, which is thicker than that of the underlying nitride liner. In addition, the stress of the PMD layer is typically lower than that of the nitride liner. Therefore, it is beneficial to perform the thermal anneal immediately after forming the nitride liner to convert the liner to a high stress state to avoid reducing the effective stress exerted on the transistors due to the potential confinement of the PMD layer. As shown in FIG. 1(d), metal contacts 130 can be formed to the source and drain regions 70 of the MOS transistor structure shown in FIG. 1(c). Standard photolithograpy can be used to etch contact holes to the silicide regions 80 overlying the source and drain regions 70. Metal is then used to fill the contact holes to form contact structures 130 to the MOS transistor source and drain regions 70.

The embodiment of the instant invention illustrated in FIG. 1(a) through FIG. 1(d) applies equally well to both NMOS and PMOS transistors. Whether a transistor is NMOS or PMOS will depend on the conductivity type of the substrate 10, doped extension regions 50, and the source and drain regions 70. For NMOS transistors, the source and drain regions 70 and the doped extension regions 50 will be n-type and the substrate will be p-type. For PMOS transistors, the source and drain regions 70 and the doped extension regions 50 will be p-type and the substrate will be n-type.

While this invention has been described with reference to illustrative embodiments, this description is not intended to be construed in a limiting sense. Various modifications and combinations of the illustrative embodiments, as well as other embodiments of the invention will be apparent to persons skilled in the art upon reference to the description. It is therefore intended that the appended claims encompass any such modifications or embodiments.

We claim:

1. A method of forming an integrated circuit, comprising:
   providing a semiconductor substrate;
   forming a gate dielectric layer on a surface of said semiconductor substrate;
   forming a gate electrode over said gate dielectric layer;
   forming sidewall structures adjacent said gate electrode;
   forming source and drain regions in said semiconductor substrate adjacent said sidewall structures;
   forming a silicon nitride layer with a first hydrogen concentration greater than 20 atomic percent and a first tensile stress over said gate electrode and said source and drain regions;
   thermally annealing said silicon nitride layer resulting in a second hydrogen concentration different than the first hydrogen concentration and a second tensile stress in said silicon nitride layer wherein said second tensile stress is greater than said first tensile stress; and forming a dielectric layer over said silicon nitride layer.

2. The method of claim 1 wherein said silicon nitride layer is formed at temperatures less than 350°C.

3. The method of claim 2 wherein said silicon nitride layer comprises a hydrogen concentration greater than 12 atomic percent following said thermal annealing.

4. The method of claim 1 wherein said first tensile stress is about 500 MPa.

5. The method of claim 4 wherein said second tensile stress is greater than 800 MPa.

6. The method of claim 5 wherein said silicon nitride layer is thermally annealed at temperatures from 300°C. to 900°C.

7. A method of forming an integrated circuit MOS transistor, comprising:

providing a semiconductor substrate;

forming a gate dielectric layer on a surface of said semiconductor substrate;

forming a gate electrode over said gate dielectric layer;

forming sidewall structures adjacent said gate electrode;

forming source and drain regions in said semiconductor substrate adjacent said sidewall structures;

forming a silicon nitride layer over said gate electrode and said source and drain regions at a temperature less than 350degree C., wherein said silicon nitride layer comprises a first hydrogen concentration greater than 20 atomic percent and a first tensile stress;

thermally annealing said silicon nitride layer resulting in a second hydrogen concentration different than the first hydrogen concentration and a second tensile stress in said silicon nitride layer wherein said second tensile stress is greater than said first tensile stress; and forming a dielectric layer over said silicon nitride layer.

8. The method of claim 7 wherein said silicon nitride layer comprises a hydrogen concentration greater than 12 atomic percent following said thermal annealing.

9. The method of claim 7 wherein said first tensile stress is about 500 MPa.

10. The method of claim 9 wherein said second tensile stress is greater than 800 MPa.

11. The method of claim 10 wherein said silicon nitride layer is thermally annealed at temperatures from 300°C. to 900°C.

12. A method of forming an integrated circuit, comprising:

providing a semiconductor substrate;

forming a gate dielectric layer on a surface of said semiconductor substrate;

forming a gate electrode over said gate dielectric layer;

forming sidewall structures adjacent said gate electrode;

forming source and drain regions in said semiconductor substrate adjacent said sidewall structures;

forming a silicon nitride layer with a hydrogen concentration greater than 20 atomic percent and a first tensile stress over said gate electrode and said source and drain regions;

thermally annealing said silicon nitride layer resulting in a second hydrogen concentration and a second tensile stress in said silicon nitride layer wherein said second hydrogen concentration is at least 12 atomic percent and said second tensile stress is greater than said first tensile stress; and forming a dielectric layer over said silicon nitride layer.

13. The method of claim 12 wherein said first tensile stress is about 500 MPa.

14. The method of claim 12 wherein said second tensile stress is greater than 800 MPa.

15. The method of claim 12 wherein the combination of high tensile stress and hydrogen concentration following mid thermal annealing increases carrier mobility in a channel region of said integrated circuit.

16. The method of claim 12 wherein said silicon nitride layer is thermally annealed at temperatures from 300°C. to 900°C.

17. The method of claim 12 wherein said silicon nitride layer is formed at temperatures less than 350°C.

18. The method of claim 12 wherein said integrated circuit comprises an NMOS translator.

19. The method of claim 12 wherein said integrated circuit comprises a PMOS translator.

* * * * *